United States Patent [19]

Schmidt et al.

[11] Patent Number: 5,651,899
[45] Date of Patent: Jul. 29, 1997

[54] STRUCTURING OF PRINTED CIRCUIT BOARDS

[75] Inventors: Walter Schmidt, Zürich; Marco Martinelli, Neftenbach, both of Switzerland

[73] Assignee: Dyconex Patente AG, Zug, Switzerland

[21] Appl. No.: 532,595

[22] PCT Filed: Feb. 1, 1995

[86] PCT No.: PCT/CH95/00022
§ 371 Date: Sep. 29, 1995
§ 102(e) Date: Sep. 29, 1995

[87] PCT Pub. No.: WO95/21517
PCT Pub. Date: Aug. 10, 1995

[30] Foreign Application Priority Data

Feb. 1, 1994 [GB] United Kingdom ............... 9401869

[51] Int. Cl.⁶ ........................................ B44C 1/22
[52] U.S. Cl. ........................ 216/18; 216/40; 216/47; 216/67
[58] Field of Search .................... 216/17, 18, 40, 216/41, 44, 67, 78, 105, 47, 52; 427/97; 29/852

[56] References Cited

U.S. PATENT DOCUMENTS

| 4,268,349 | 5/1981 | Hacke et al. ............... 216/47 X |
| 4,610,755 | 9/1986 | Beckett ...................... 156/634 |
| 4,711,791 | 12/1987 | Wiseman ....................... 427/96 |
| 4,943,346 | 7/1990 | Mattelin ................... 216/47 X |
| 5,544,773 | 8/1996 | Haruta et al. ................ 216/13 |

FOREIGN PATENT DOCUMENTS

| 395411 | 10/1990 | European Pat. Off. |
| WO92/15408 | 9/1992 | WIPO |
| WO93/26143 | 12/1993 | WIPO |

Primary Examiner—William Powell
Attorney, Agent, or Firm—Walter C. Farley

[57] ABSTRACT

In the method according to the invention for the production of multilayer foil printed circuit board from preliminary products (A), with current paths (B) structured in electrical conductive layers (1,3) and with electrically conductive metal platings (C,D) from conductive layer (1) to conductive layer (3) through an insulating layer (2), or for producing semifinished products for such foil circuit boards, in first method steps a structuring means (7,7',13) is applied in controlled, local manner to the preliminary product (A) and resist layers (8,9) are coated with the preliminary product (A), the structuring means (7,7',13) being applied either to the resist layers (8,9) and the resist layer (8,9) is locally removed, or the resist layers (8,9) are applied to the structuring means (7,7',13) and in a further method step the applied structuring means (7,7',13) are removed, so that openings (10,10') are formed in the resist layers (8,9) and extend down to the insulating layer (2) and in a further method step through or blind holes (11,11') are locally etched in the insulating layer (2) at the position of the openings (10,10') and for producing electrically conductive metal platings (C,D) electrically conductive deposition substances (12) are deposited in the through or blind holes (11,11').

14 Claims, 5 Drawing Sheets

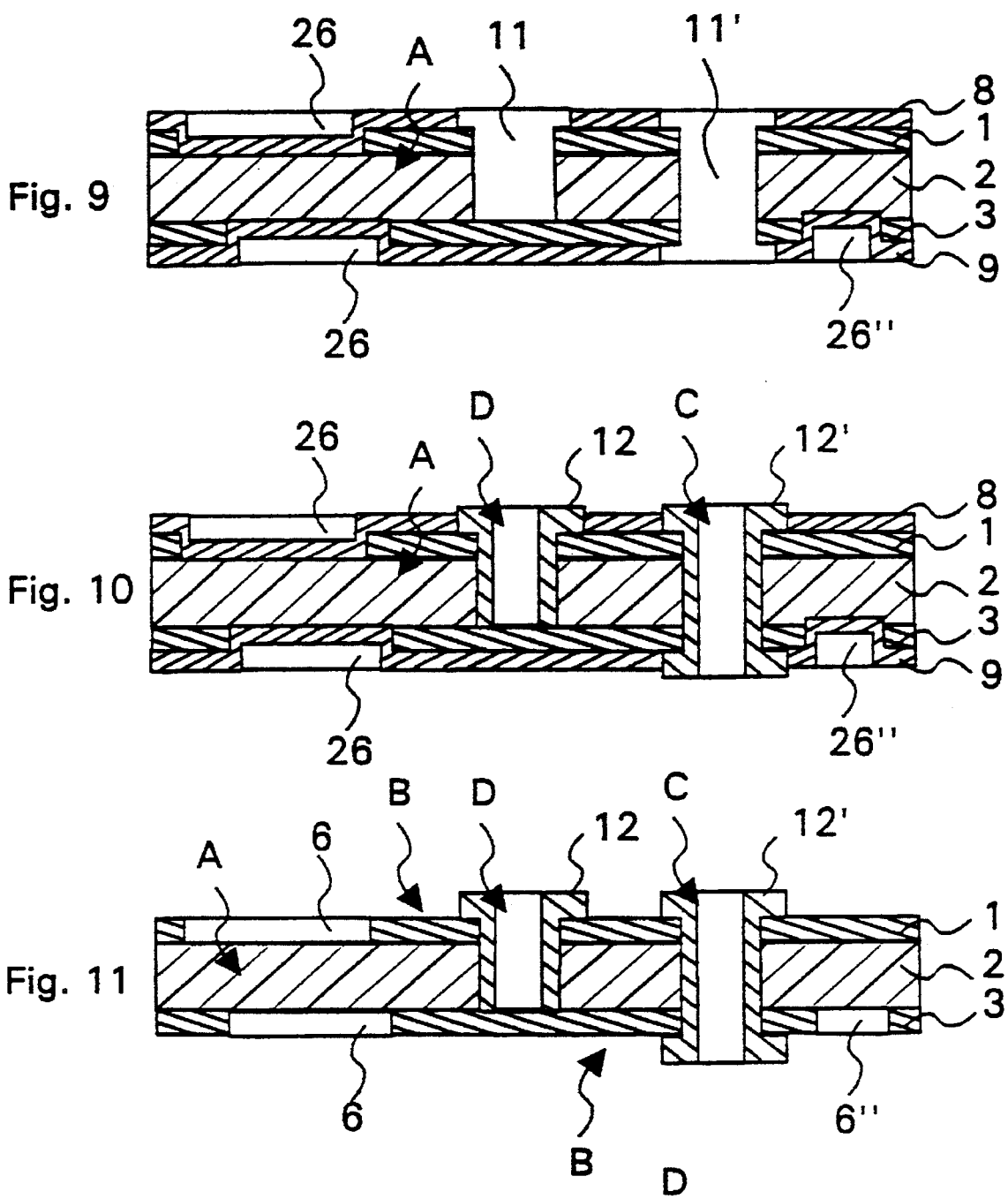

5,651,899

STRUCTURING OF PRINTED CIRCUIT BOARDS

BACKGROUND OF THE INVENTION

1. Field of the Invention

The invention relates to the production of printed circuit boards and deals with foil printed circuit boards with metal platings in etched through or blind holes and a method for the production of such boards or the semifinished products used in their production.

2. Background of the Invention

In the production of thin, multilayer foil circuit boards it has hitherto been necessary to carry out two separate structurings by means of photochemical methods, namely the structuring of through and blind holes, which have to be subsequently plated on, and the structuring of the current paths and pads, which run in electrically conducting layers of foil circuit boards and in plated-on holes.

Although said structurings take place according to known, proven photochemical methods, which are widely used in electrical engineering, there are fundamental disadvantages in such a two-stage production process. Two such structurings are more than twice as expensive as one, photomasks must be produced for each of the said structurings, which require precise positioning and also photoresist layers must be applied to the preliminary product and then removed again.

Two structurings lead to lower outputs than one alone. The total output of two sequentially performed production processes is formed from the product of the individual outputs, i.e. the wastage in the first production process limits the output in the following process.

Two such structurings give rise to extra production costs, which limits the potential physical and electronic possibilities of the photochemical method used.

The production tolerances cause such a restriction. Thin, multilayer foil circuit boards with thicknesses below 100 µm and through and blind holes with a diameter below 100 µm must in the case of two exposures with different photomasks for said two structurings have certain production tolerances, which rapidly reach the same order of magnitude as the actual structures.

The thicknesses of the current paths and the metal platings give rise to such a restriction. Following a structuring of the through and blind holes, the latter e.g. undergo plasma etching and are e.g. plated on with copper. The resulting metal platings in the through and blind holes deteriorate the dimensional stability of the foil circuit board, because electrodeposited metal layers are not strain-free. Galvanic plating leads to an increase in the thickness of the top metal foil of the foil circuit board. The thicker a metal layer, the more difficult it is to chemically etch. The physical advantage of very small dimensions on foil circuit boards is consequently limited, as is the electronic advantage of thin current paths.

It is desirable to have a method which would eliminate these disadvantages of double structuring and which would make it possible to obtain thin, light and rapidly etchable metal layers with limited effort, low costs, low wastage and good dimensional stability. Known and proven methods, materials, etc. are to be used. For example, for structuring the conductive pattern known methods must be usable. The method must also be compatible with respect to the further processing and with varying dimensions of components to be assembled using known methods. Finally only one photochemical structuring must be needed for producing one or two layers of current paths and metal platings in through and blind holes of foil circuit boards.

SUMMARY OF THE INVENTION

Such foil circuit boards and semifinished products with metal platings can be produced according to the invention. In the method according to the invention for the production of multilayer foil circuit boards and for the production of semifinished products for such foil circuit boards with electrically conductive metal platings in through and blind holes only the current paths and pads are photochemically structured in conductive layers of preliminary products. The structuring of openings for the etching of through or blind holes in or through an insulating layer takes place in a non-photochemical structuring, with an ultrafine, planned locally applied and removable structuring means or material and with resist layers applied in surface coveting manner and reacting in combination with said structuring means.

The method according to the invention is used for the production of multilayer foil circuit boards from preliminary products, which in electrically conductive layers have structure current paths, which have electrically conducting metal platings between different conductive layers through an insulating layer, or for producing semifinished products for such foil circuit boards. In first method steps a structuring material reactable with the resist layers is applied in controlled, local manner to the preliminary product and resist layers are coated with the preliminary product. Either the structuring material is applied to the resist layers or the resist layers are applied to the structuring material. In further method steps the resist layers are locally removed by reacting with the structuring material and the latter is removed, so that openings have formed in the resist layers and extend down to the insulating layer.

The structuring material is e.g. applied in drop form in planned manner to the insulating layer in a printed screen. Such a structuring material can position on existing layers resist layers over the insulating layer or can be directly positioned on the latter. Through its presence and extension the structuring material locally prevents access of insulating layer-etching media to the insulating layer. The presence and extension of the structuring material also locally prevents the application of resist layers to the insulating layer. The structuring material can be a resist layer-etching medium, so that through said structuring material locally present layers of resist material can be etched.

The structuring material can be removed again. It has a self-dissolving action. By activating from the outside, e.g. by material of heat or a solvent, it can be locally removed again at a selected time. The resulting removal of structuring material advantageously takes place completely, e.g. it is evaporated, sublimated or dissolved. The removal of the structuring material and the resist layers takes place in different method variants by activated reactions. In a first variant the structuring material tears away resist layers, e.g. vapor deposited, thin aluminum layers. In another variant the structuring material etches through resist layers, e.g. through vapor deposited, thin aluminum layers. Thus, as a result of the removal of structuring material, openings are formed in the resistant layers, so that there is planned, local access of insulating layer etching media to the insulating layer. Through said openings and advantageously only said openings it is possible to apply in planned manner at desired positions structures in the insulating layer, such as through or blind holes, e.g. by further etching processes. The resist layers protect the remaining preliminary product surfaces

3 against said etching action. Such etched structures in the insulating layer are then plated on, so that electrically conductive metal platings are formed in the through or blind holes of the insulating layer.

BRIEF DESCRIPTION OF THE DRAWINGS

By material of the drawings enumerated hereinafter, the foil printed circuit boards according to the invention with etched through or blind holes in the insulating layers and the method according to the invention for producing said boards and for producing semifinished products for said boards are explained in greater detail.

FIGS. 1 to 11 are sectional views showing steps of a first variant of the method according to the invention for the photochemical structuring of current paths and pads on a part of a preliminary product and the structuring of through or blind holes with a structuring material and resist layers.

DESCRIPTION OF THE PREFERRED EMBODIMENTS

Figure 1:
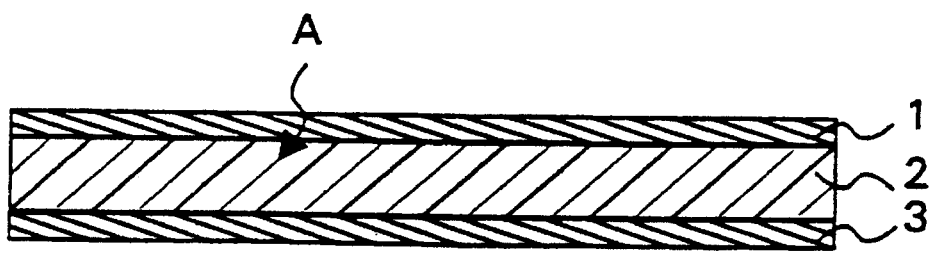

In FIGS. 1 to 11 it is possible to see a first variant of the method according to the invention for the photochemical structuring of current paths and pads on part of a preliminary product and the structuring of through or blind holes with a structuring material and with resist layers. The preliminary product and the method steps are shown in the drawings in a section along the flat extension of the product. The through or blind holes to be produced are intended to interconnect at least two electrically conductive layers or conductive layers separated from one another by a plastic or insulating layer. Thus, the through and blind holes alternatively penetrate intermediate insulating layers positioned between conductive layers and in each case connect at least two such conductive layers. They need not be perpendicular to the surface of the plastic layer to be penetrated and can also pass through or into the same in an inclined manner.

FIG. 1 shows a preliminary product A of the method. Advantageously use is made of a multilayer preliminary product A, which e.g. comprises an insulating or plastic layer 2 lined on two sides with electrically conductive layers 1, 3. The conductive layers 1, 3 can be copper foils, the insulating layers 2 can be suitable plastic sheets, e.g. polyimide or epoxy sheets. In place of copper foils it is also possible to use cold laminated composite foils comprising a thicker aluminum foil and thinner copper foils laminated onto either side thereof. Other suitable starting products are e.g. foils of stainless steel, brass, bronze, aluminum-magnesium alloys, Invar, molybdenum, etc. These conductive layers 1,3 and the plastic sheet 2 are 3 to 100 μthick. The preliminary product A can be rigid or flexible.

Figure 2:
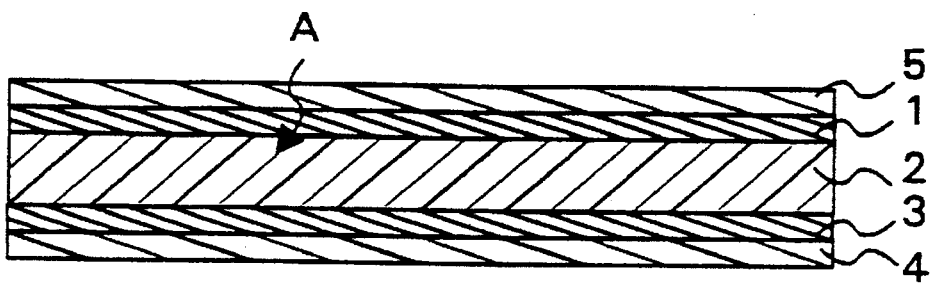

FIG. 2 shows the preliminary product A of FIG. 1 coated on both sides with photoresist 4,5. The conductive layers 1,3 are completely covered with photoresist 4,5. A solid or liquid photoresist can be used. The photoresist layers 4,5 can be exposed in known, photochemical processes, so that conductive pattern structures and through or blind holes are transferred by material of a photomask.

Figure 3:
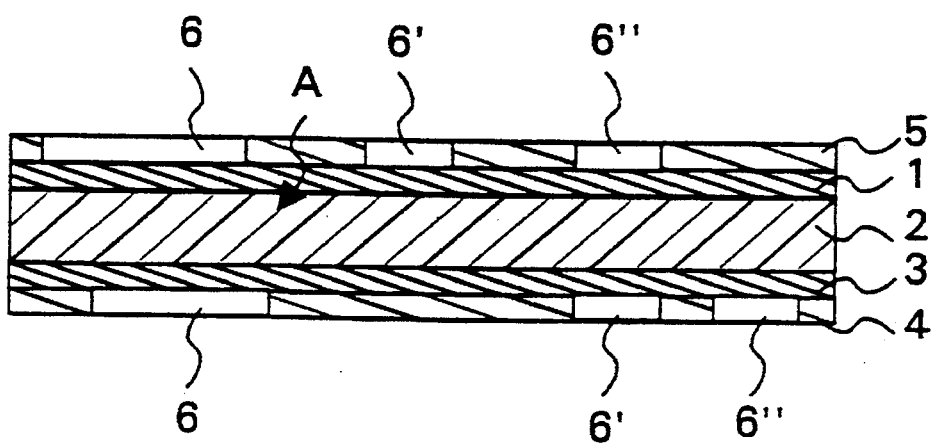

FIG. 3 illustrates this photochemically performed structuring of the photoresist layers 4,5. Conductive pattern,

4 through and blind hole structures 6,6',6" are applied to the structured photoresist layer 4,5. These structures extend down to the conductive layers 1,3 and their typical diameter is 25 to 100μm. These structures, 6,6'6" are freely selectable and can be circular cylindrical, round, oval, square, rectangular and polygonal. These structures 6, 6',6" are used for the indirect transfer of the circuit layout (current paths, pads, etc.) and information concerning the position and structure of the openings for blind and through holes to be produced in the conductive layers 1,3. This transfer is indirect, because in all areas where photoresist 4,5 is present, no electrically conductive material of the conductive layers 1,3 is removed in the following method steps.

Figure 4:
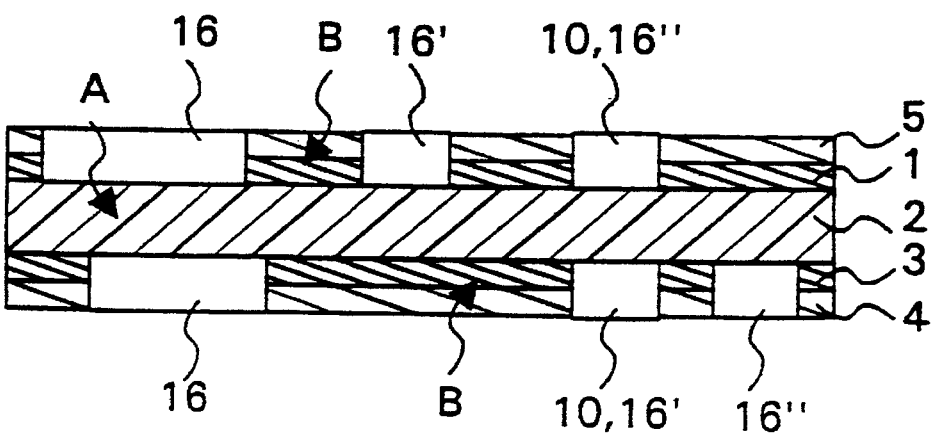

FIG. 4 shows the preliminary product A photochemically structured in this way following the wet chemical etching of the material of the conductive layers 1,3 not covered by the photoresist 4, 5. This etching leads to the planned removal of individual areas of the conductive layers 1,3. As a result current paths or pads B separated by insulating areas 16,16', 16" and prefabricated openings 10,10' in the conductive layers 1,3 are formed for through or blind holes to be produced in the insulating layer 2. Wet chemical etching takes place in planned depth manner, i.e. the conductive layers 1,3 are removed down to the plastic sheet 2 in the areas not covered by the photoresist 4,5. Wet chemical etching takes place simultaneously in all exposed areas (i.e. the areas accessible for the etching chemicals and liquids).

Figure 5:
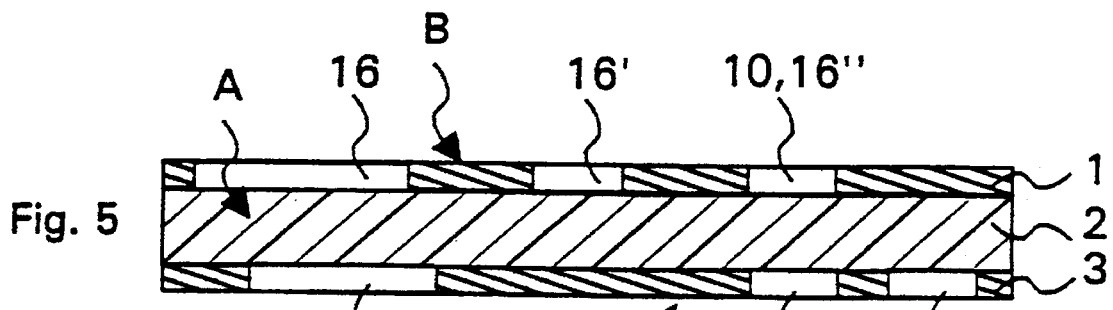

FIG. 5 shows the preliminary product A in the production stage according to FIG. 4 after the stripping of the photoresist layers 4,5, which takes place by material of known, proven chemical processes.

Figure 6:
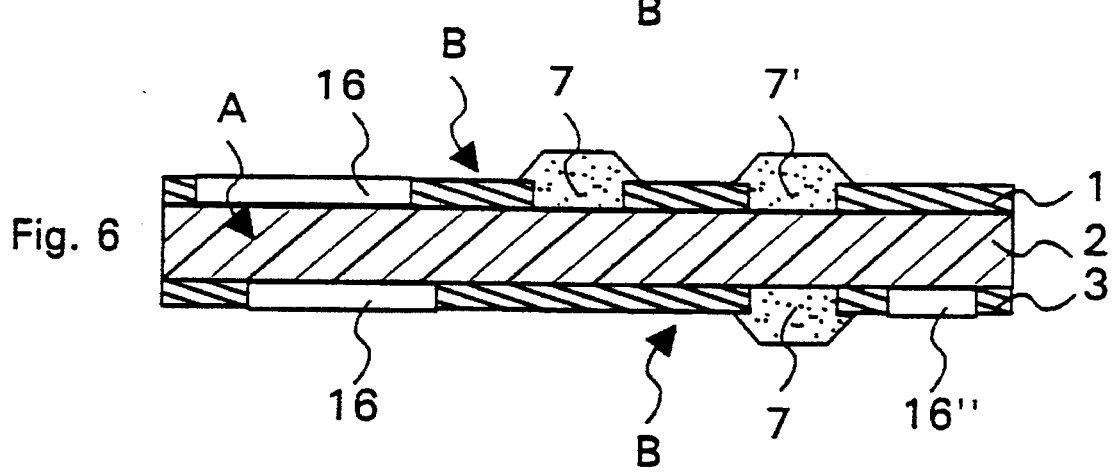

FIG. 6 shows the preliminary product A following the planned, local application of a structuring material 7,7' to the insulating layer 2. This takes place by material of known, proven processes and is e.g. printed on in a screening and offset printing process. Advantageously the structuring material 7,7' are constituted by droplets, e.g. resin droplets, which are of roughly the same size as the structures to be produced. In accordance with a layout, said structuring material 7,7' are applied in planned manner at positions for openings 10,10' to be produced for the through or blind holes in the insulating layer 2. Such a small resin droplet is therefore pressed with um precision into the openings 10,10' and can be briefly dried on the substrate for better adhesion purposes. This application of resin droplets advantageously takes place simultaneously on both sides of the insulating layer 2. With the knowledge of the invention these problems are known and can be solved by the printing expert.

Figure 7:
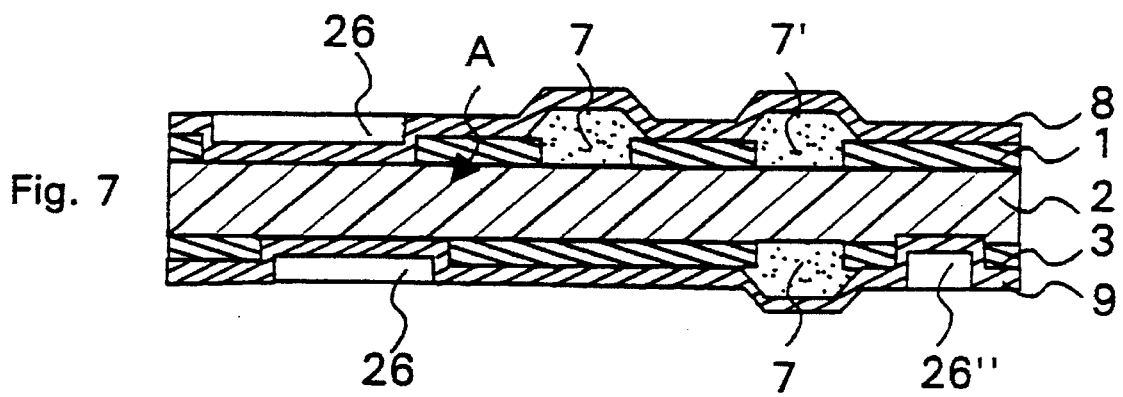

FIG. 7 shows the preliminary product A according to FIG. 6 printed in planned, local manner with structuring material 7,7'following the application of the resist layers 8,9, which completely cover the insulating layer 2, so that it is possible to structure by etching the insulating layer 2 according to the openings in said layers 8,9. Advantageously the resist layers 8,9 are thin metal layers, e.g. vapour deposited aluminum layers in the m or sub-μm range of 150 to 200 nm thickness. It is naturally also possible to use other metal layers, such as e.g. copper and also non-metallic layers can be used as resist layers. Such thin resist layers are known to the thin film technology expert, e.g. as vacuum depositions or vacuum deposited mirrors.

Figure 8:
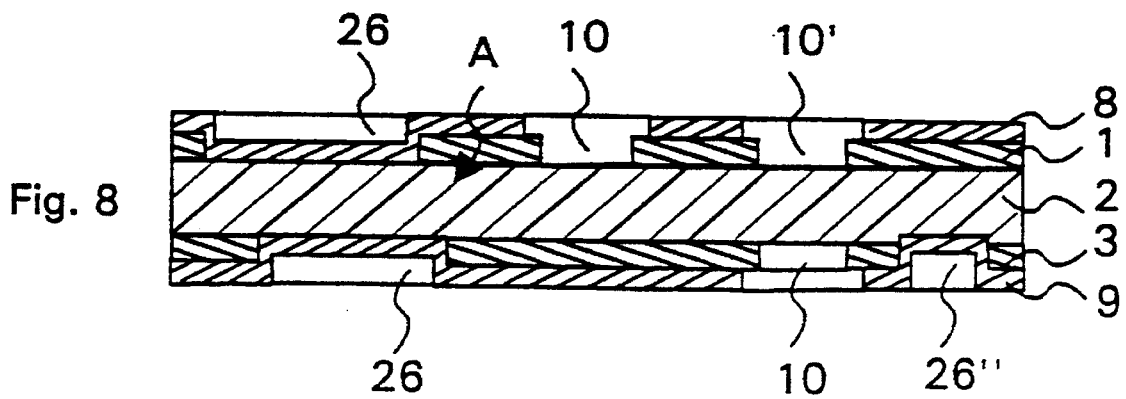

FIG. 8 shows the preliminary product A according to FIG. 7 following the planned, local removal of the structuring material 7,7' and the resulting rendering accessible of the insulating layer 2 via openings 10,10' in the conductive layers 1,3 and in the resist layers 8,9. The structuring material 7,7' is self-dissolving as a result of an activated reaction. This self-dissolving of the structuring material 7,7' is e.g. activated by a slight temperature rise i.e. by evaporation or sublimation, or it is activated by a bath or by contact with a solvent, i.e. by dissolving in a medium. Advantageously the structuring material 7,7' is completely dissolved. The structuring material 7,7' tears away the thin resist layers 8,9 applied to the said structuring material 7,7', so that in place thereof openings 10,10' are formed in the conductive layers 1,3 and in the resist layers 8,9 and on the insulating layer 2. The preliminary product A is covered with the resist layers 8,9 and only at predetermined positions of the openings 10,10' is the resist layer 8,9 broken away and said openings 10,10' extend down to the insulating layer 2. Therefore the openings 10,10' can be used for the planned, local etching of through and blind holes in the insulating layer 2.

FIG. 9 shows a preliminary product A according to FIG. 8 after etching through and blind holes 11,11' in the insulating layer 2. The through and blind holes 11 are only etched at the position of openings 10,10' in the conductive layers 1,3 and resist layers 8,9. Etching advantageously takes place by plasma etching, but it is also possible to use other insulating layer etching methods, e.g. chemical etching solutions. The resist layers 8,9 are e.g. made from aluminum and are consequently resistant to plasma etching. The areas of the preliminary product A covered by the resist layers 8,9 are protected against plasma action. Through holes are etched between two openings in the resist layers on different surfaces of the insulating layer 2 and blind holes are only etched at a single opening in a resist layer 8,9.

FIG. 10 shows a plasma-etched preliminary product A according to FIG. 9 after plating on a layer of deposition substance 12,12' of an electrically conductive material, e.g. copper. In this known, proven, chemical and galvanic process the deposition substance 12,12' is electrochemically deposited in areas not covered with resist layers 8,9, i.e. in the through and blind holes 11,11' of the preliminary product A. Plated-on through and blind holes 11,11' are called metal platings C,D. The substance 12,12' deposited for this purpose is thin with thicknesses below 25 μm.

FIG. 11 shows the preliminary product A according to FIG. 10 after removing the resist layers 8,9. This preliminary product A shows a first construction of a two-layer foil circuit board using the method according to the invention. This foil circuit board has current paths and pads B, metal platings C,D and insulating surface areas of the insulating layer 2. The metal platings C,D have electrical contacts with the current paths and pads B via connecting areas 6,6',6".

FIGS. 12 to 19 illustrate a second variant of the method according to the invention for the photochemical structuring of current paths and pads on part of a preliminary product and the structuring of through and blind holes by material of structuring material and resist layers. The sequence for said second variant largely follows that of the first variant described with respect to FIGS. 1 to 11, so that the differences only will be explained hereinafter.

In both variants of the method according to the invention the structuring material 7,7',13 is applied to conductive layers 1,3 and resist layers 8,9 on the insulating layer 2. The fundamental difference between the first and second variants of the inventive method is that the structuring material 7,7' in the first variant are applied in openings 10,10' in the conductive layers 1,3 on the insulating layer 2 and in the second variant the structuring material 13 is applied to the resist layers 8,9 on the insulating layer 2.

Figure 12:
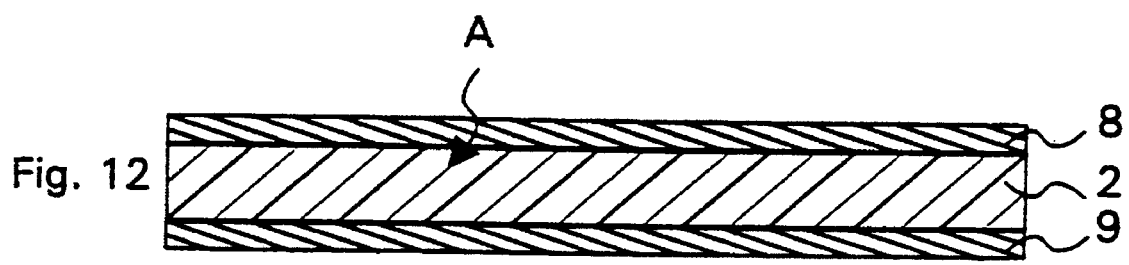
FIGS. 12 to 19 are sectional views showing steps of another variant of the method according to the invention for the photochemical structuring of current paths and pads on part of a preliminary product and the structuring of through or blind holes with a structuring material and with resist layers.

FIG. 12 shows a preliminary product A of the method. Advantageously use is made of a multilayer preliminary product A, which e.g. comprises an insulating layer or plastic sheet 2 lined on both sides with resist layers 8,9. The properties of such an insulating layer 2 have been mentioned in the description relative to FIG. 1. The resist layers 8,9 are advantageously constituted by thin metal layers, e.g. vapour deposited aluminum layers, as stated in the description relative to FIG. 7. The resist layers 8,9 completely cover the insulating layer 2, so that a structuring by etching the insulating layer 2 in accordance with the openings in said resist layers 8,9 is possible. These openings are applied in the thin resist layers 8,9 in the following method according to the invention.

Figure 13:
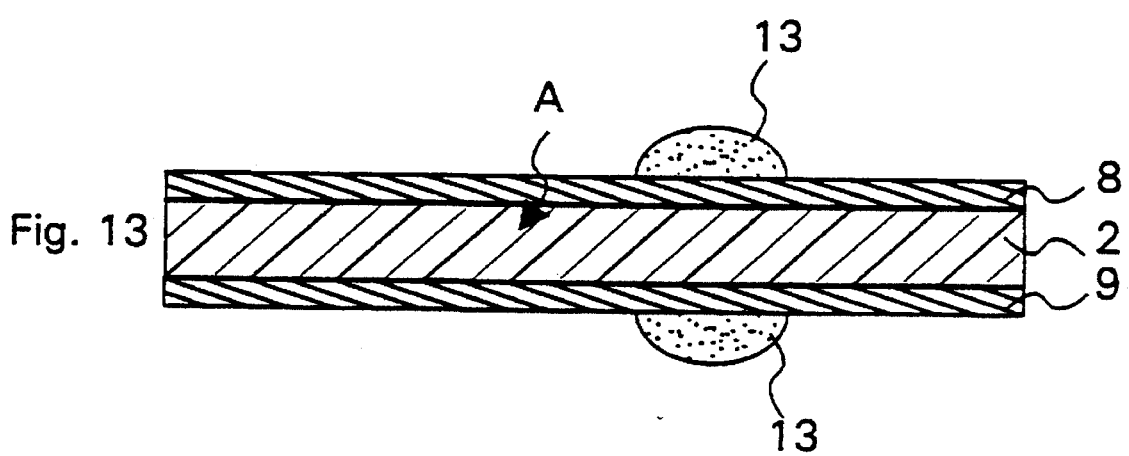

FIG. 13 shows the preliminary product of FIG. 12 following the planned, local application of a structuring material 13 to the insulating layer 2 and as explained in detail relative to FIG. 6. In advantageous embodiments the structuring material 13 are constituted by small droplets, e.g. resin droplets, which according to a layout are applied in planned manner at the positions for the openings 10,10' to be produced for through or blind holes in the insulating layer 2 on the resist layers 8,9.

Figure 14:
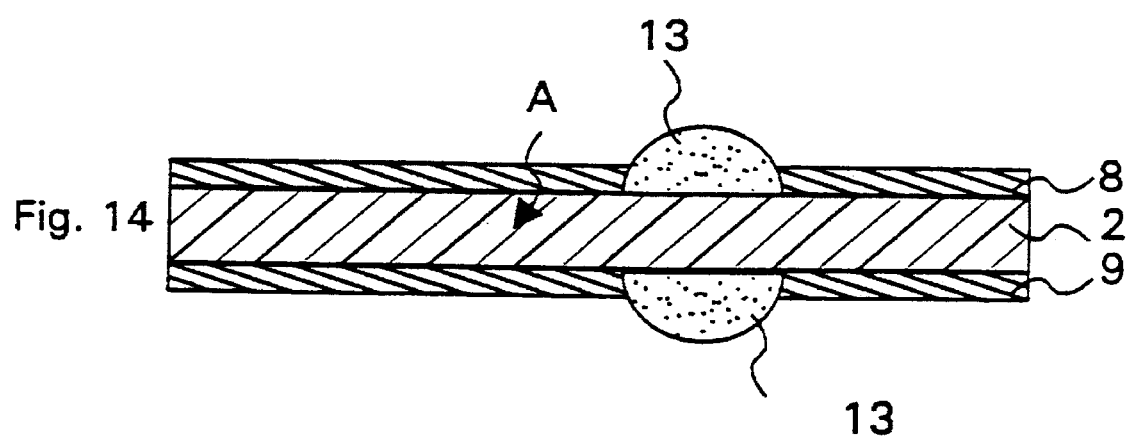

FIG. 14 shows the preliminary product A according to FIG. 13 printed in planned, local manner with structuring material 13, following the local removal of the resist layers 8,9 applied to the insulating layer 2 by the structuring material 13. For this purpose a conductive layer-etching structuring material 13 is used. The resist layers 8,9 under the structuring material 13 are locally etched through to the insulating layer 2 by the structuring material 13. This etching takes place using corroding materials known to the expert.

Figure 15:
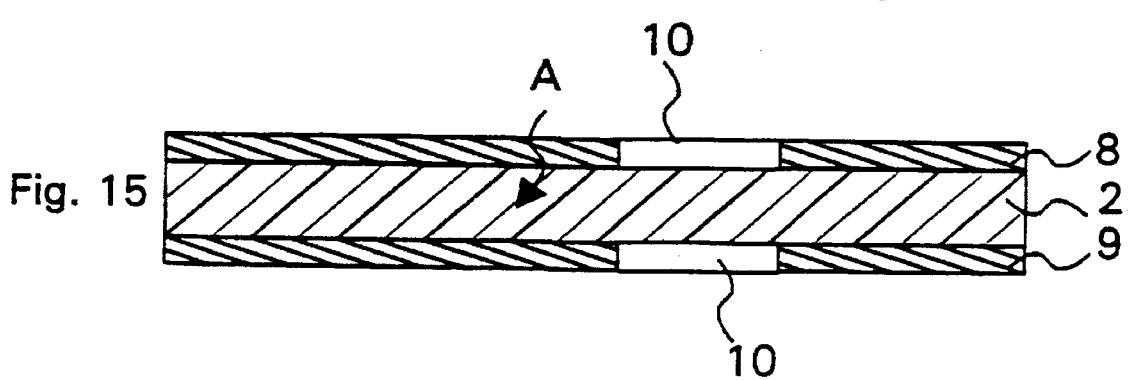

FIG. 15 shows the preliminary product A according to FIG. 14 following the planned, local removal of the structuring material 13 and the resulting rendering accessible of the insulating layer 2 by material of openings 10 in the resist layers 8,9. As explained in detail relative to FIG. 8, the structuring material 13 is self-dissolving as a result of activation. It conveys away the locally dissolved resist layers 8,9, so that in place thereof openings 10 are formed in the resist layers 8,9 and on the insulating layer 2. The preliminary product A is now covered with resist layers 8,9 and can then be used by material of openings 10 applied in planned, local manner and which extend down to the insulating layer 2, for the planned, local etching of through and blind holes in the insulating layer 2.

Figure 16:
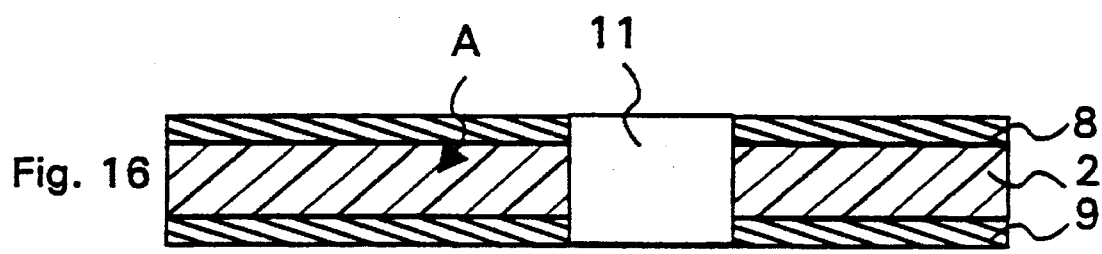

FIG. 16 shows a preliminary product A according to FIG. 15 following the etching of through holes 11 in the insulating layer 2. The through holes 11 are only etched at the position of openings 10 in the resist layers 8,9. Etching advantageously takes place by plasma etching and as explained relative to FIG. 9.

Figure 17:
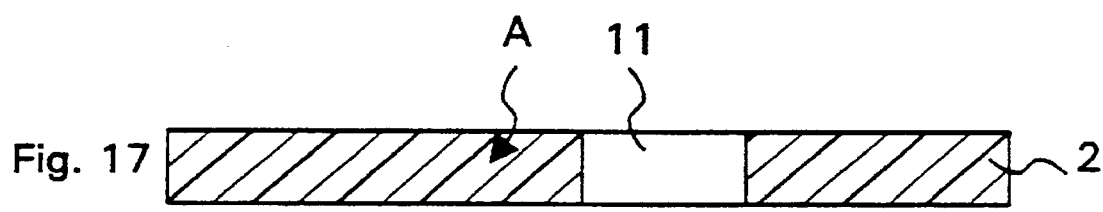

FIG. 17 shows the preliminary product A according to FIG. 16 after removing the resist layers 8,9. Thus, it is possible to see the insulating layer 2 with planned, locally structured through holes 11.

Figure 18:
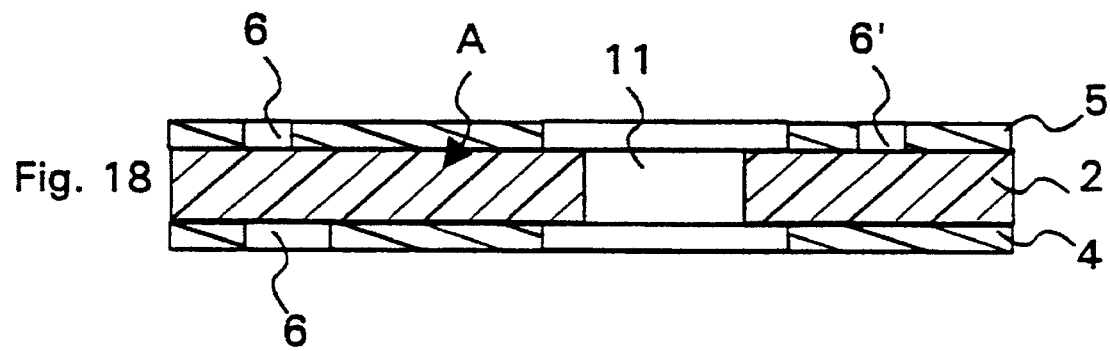

FIG. 18 shows the preliminary product A according to FIG. 17 after being coated with photoresist 4,5 on both sides and after exposing said photoresist layers 4,5 using known photochemical processes, so that conductive pattern structures are transferred via a photomask. Reference should be made to the description concerning FIGS. 2 and 3 for further details. FIG. 18 shows photochemically structured photoresist layers 4,5 extending down to the insulating layer 2. Unlike in the first variant of the method, the photoresist 4,5 of the second variant is permanently fixed on the insulating layer 2. This permanent photoresist 4,5 transfers the layout (current paths, pads, etc.) directly to the preliminary product A and there is consequently no indirect structuring by chemical etching in accordance with structures in the photoresist 4,5, as disclosed in the first variant.

Figure 19:
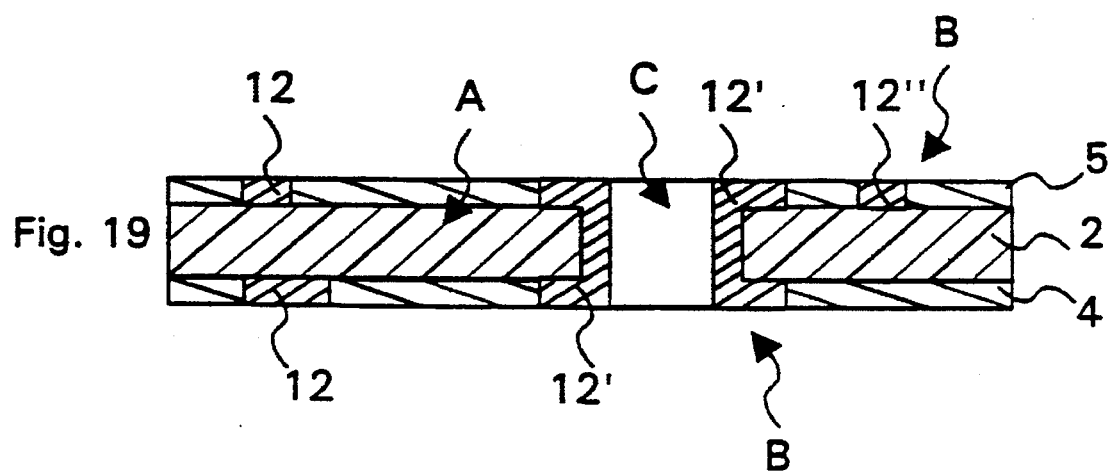

FIG. 19 shows a preliminary product A according to FIG. 18 following the chemical deposition of a deposition substance 12,12',12" comprising an electrically conductive material, e.g. palladium. In this known, proven chemical process the deposition substance 12,12',12" is electrochemically deposited in areas 6,6' and 11 of the preliminary product A not covered with permanent photoresist 4,5. In this way the current paths and pads B are formed in the photoresist-free area 6,6'. In the also photoresist-free through holes 11 metal platings C are formed by the deposition of the substance 12,12',12". The substance 12, 12',12" deposited for this purpose is thin being less than 25 μm thick. The preliminary product A shows a further construction of a two-layer foil circuit board using the method according to the invention with current paths, pads B and metal platings C.

We claim:

1. A method for producing a multilayer foil printed circuit board comprising the steps of forming a preliminary product comprising an insulating layer having conductive layers on opposite surfaces thereof, photochemically removing selected portions of the conductive layer on at least one side of the preliminary product to form electrical current paths thereon leaving conductive material remaining on the preliminary product and exposed regions of insulating material, applying to selected locations of the exposed insulating material a structuring material selected to be reactive with a selected resist material, coating the surfaces of the product including the structuring material with the selected resist material, and stimulating the structuring material to react with the resist material to thereby remove the resist material and the structuring material from the selected locations, thereby exposing the insulating material at the selected locations.

2. A method according to claim 1 and further including the steps of etching the insulating material at the exposed, selected locations to form openings therein or therethrough, and depositing electrically conductive material in the etched openings.

3. A method according to claim 1 wherein the step of stimulating includes thermally activating the structuring material for removal by sublimation or evaporation, and wherein removal of the structuring material removes the resist material with the structuring material at the selected locations.

4. A method according to claim 1 wherein the step of applying includes pressing droplets onto the selected locations, the droplets having diameters of between 25 μm and 100 μm.

5. A method according to claim 1 wherein exposed regions of insulating material comprise openings through conductive material, the method further including the step of etching the insulating material by supplying an etching medium through the openings in the conductive material at exposed, selected locations to form openings therein or therethrough the insulating material.

6. A method according to claim 5 wherein the etching medium is a plasma etching medium.

7. A method for producing a multilayer foil printed circuit board comprising the steps of forming a preliminary product comprising an insulating layer having conductive layers on opposite surfaces thereof, photochemically removing selected portions of the conductive layer on at least one side of the preliminary product to form electrical current paths thereon leaving conductive material remaining on the preliminary product and exposed regions of insulating material, selecting a structuring material selected to be reactive with a selected resist material, coating the surfaces of the product with the selected resist material, applying the structuring material to selected locations of the product at which exposed insulating material is covered only by the resist material, and stimulating the structuring material to react with the resist material to thereby remove the resist material and the structuring material from the selected locations, thereby exposing the insulating material at the selected locations.

8. A method according to claim 7 and further including the steps of etching the insulating material at the exposed, selected locations to form openings therein or therethrough, and depositing electrically conductive material in the etched openings.

9. A method according to claim 7 wherein the step of stimulating includes thermally activating the structuring material for removal by sublimation or evaporation, and wherein removal of the structuring material removes the resist material with the structuring material at the selected locations.

10. A method according to claim 7 wherein the step of applying includes pressing droplets onto the selected locations, the droplets having diameters of between 25 μm and 100 μm.

11. A method according to claim 7 wherein exposed regions of insulating material comprise openings through conductive material, the method further including the step of etching the insulating material by supplying an etching medium through the openings in the conductive material at exposed, selected locations to form openings therein or therethrough the insulating material.

12. A method according to claim 11 wherein the etching medium is a plasma etching medium.

13. A method according to claim 7 wherein the etch material is selected to etch through and remove the resist material at the selected locations.

14. A method according to claim 13 wherein the resist material is aluminum having a thickness of between 150 nm and 200 nm.

* * * * *